United States Patent
Papapolymerou et al.

(10) Patent No.: US 12,027,477 B2
(45) Date of Patent: Jul. 2, 2024

(54) METHOD OF ADDITIVELY MANUFACTURING AN INTEGRATED CIRCUIT OF AN INTERCONNECT PACKAGING STRUCTURE

(71) Applicant: Board of Trustees of Michigan State University, East Lansing, MI (US)

(72) Inventors: Ioannis Papapolymerou, Okemos, MI (US); Premjeet Chahal, Okemos, MI (US); John D. Albrecht, Okemos, MI (US); Michael Thomas Craton, Lansing, MI (US); Christopher Oakley, Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 837 days.

(21) Appl. No.: 17/056,188

(22) PCT Filed: May 15, 2019

(86) PCT No.: PCT/US2019/032501
§ 371 (c)(1),
(2) Date: Nov. 17, 2020

(87) PCT Pub. No.: WO2019/222410
PCT Pub. Date: Nov. 21, 2019

(65) Prior Publication Data
US 2021/0217712 A1   Jul. 15, 2021

Related U.S. Application Data

(60) Provisional application No. 62/673,403, filed on May 18, 2018.

(51) Int. Cl.
*H01L 23/66*      (2006.01)
*B33Y 10/00*      (2015.01)
(Continued)

(52) U.S. Cl.
CPC .............. *H01L 23/66* (2013.01); *B33Y 10/00* (2014.12); *B33Y 30/00* (2014.12); *G01S 7/028* (2021.05);
(Continued)

(58) Field of Classification Search
CPC ......... H01L 23/66; H01L 24/06; H01L 24/19; H01L 24/24; H01L 2223/6627;
(Continued)

(56) References Cited

U.S. PATENT DOCUMENTS 6,535,116 B1   3/2003   Zhou
8,062,976 B2   11/2011  Vecchione et al.
(Continued)

FOREIGN PATENT DOCUMENTS

TW   201218468 A   *   5/2012   ........... H01L 21/486

OTHER PUBLICATIONS

Byford, et al., "Demonstration of RF and Microwave Passive Circuits," IEEE Transactions on Components, Packaging and Manufacturing Technology, vol. 7, No. 3, Mar. 2017.
(Continued)

*Primary Examiner* — Lex H Malsawma
*Assistant Examiner* — Sean Ayers Winters
(74) *Attorney, Agent, or Firm* — Harness, Dickey & Pierce, PLC (57) ABSTRACT

A method of manufacturing an interconnect packaging structure is provided. In one aspect, the method includes forming a first body defining a cavity around at least one integrated circuit using an additive manufacturing machine, depositing a conductive transmission line on the first body and electrically coupling the conductive transmission line and the at least one integrated circuit with a conductive interconnect.

18 Claims, 10 Drawing Sheets

(51) Int. Cl.
| | |
|---|---|
| B33Y 30/00 | (2015.01) |
| G01S 7/02 | (2006.01) |
| G01S 7/282 | (2006.01) |
| G01S 13/931 | (2020.01) |
| H01L 23/00 | (2006.01) |

(52) U.S. Cl.
CPC ............ *G01S 7/282* (2013.01); *G01S 13/931* (2013.01); *H01L 24/06* (2013.01); *H01L 24/19* (2013.01); *H01L 24/24* (2013.01); *H01L 2223/6627* (2013.01); *H01L 2223/6644* (2013.01); *H01L 2223/6677* (2013.01); *H01L 2224/06131* (2013.01); *H01L 2224/24227* (2013.01); *H01L 2224/24247* (2013.01)

(58) Field of Classification Search
CPC ..... H01L 2223/6644; H01L 2223/6677; H01L 2224/06131; B33Y 10/00; B33Y 30/00; G01S 7/028; G01S 7/282; G01S 13/931
See application file for complete search history.

(56) References Cited

U.S. PATENT DOCUMENTS

| | | | |
|---|---|---|---|
| 9,305,901 | B2 | 4/2016 | Dropps |
| 9,508,667 | B2 | 11/2016 | Prack |
| 9,799,617 | B1* | 10/2017 | Curiel ...................... H01L 24/24 |
| 2006/0070554 | A1* | 4/2006 | Braunreiter ............. C04B 35/01 106/711 |
| 2008/0191297 | A1* | 8/2008 | Yang ................. H01L 27/14687 257/E31.128 |
| 2010/0140811 | A1 | 6/2010 | Leal et al. |
| 2012/0161317 | A1 | 6/2012 | Rathburn |
| 2013/0027240 | A1* | 1/2013 | Chowdhury .......... G01S 13/345 342/175 |
| 2017/0129171 | A1* | 5/2017 | Gardner ................ B29C 64/106 |
| 2017/0251713 | A1* | 9/2017 | Warner .................... A23P 30/20 |
| 2018/0020683 | A1* | 1/2018 | Contractor ............. B33Y 80/00 426/231 |
| 2018/0036941 | A1* | 2/2018 | Xu ......................... B29C 64/286 |
| 2018/0065302 | A1* | 3/2018 | Arai ....................... B29C 64/245 |
| 2018/0068982 | A1* | 3/2018 | Heinrich ........... H01L 23/49503 |
| 2018/0104894 | A1* | 4/2018 | Fung ......................... C08K 3/04 |
| 2018/0207863 | A1* | 7/2018 | Porter .................... B29C 64/40 |

OTHER PUBLICATIONS

Byford, et al., "Fabrication of Terahertz Components Using 3D Printed Templates," IEEE, 2016.
Byford, et al., "Ultra-Wideband Hybrid Substrate Integrated Ribbon Waveguides Using 3D Printing," IEEE, 2016.
Cai, et al., "A Low Loss X-Band Filter Using 3D Polyjet Technology," IEEE, 2015.
Cai, et al., "High Resolution Aerosol Jet Printing of D-Band Printed Transmission Lines on Flexible LCP Substrate," IEEE , 2014.
Cai, et al., "Low-Loss 3D Multilayer Transmission Lines and Interconnects Fabricated by Additive Manufacturing Technologies," IEEE, Oct. 2016.
Craton, et al., "3D Printed High Frequency Coaxial Transmission Line Based Circuits," IEEE, 2017.
Craton, et al., "3D Printed Integrated Microfluidic Cooling for High-Power RF Applications," IMAPS, Oct. 9-12, 2017.
Craton, et al., "A Chip-First Microwave Package Using Multimaterial Aerosol Jet Printing," Aug. 2020.
Craton, et al., "A Polyjet 3D Printed Alternative for Package to RFIC Interconnects," Proceedings of the 47th European Microwave Conference, Oct. 10-12, 2017.
Craton, et al., "In Situ Nanocomposite Fabrication for RF Electronics Applications With Additive Manufacturing," IEEE, May 2020.
Ghazali, et al., "3D Printed High Functional Density Packaging Compatible Out-of-plan Antennas," Additive Manufacturing, 2019.
Ghazali, et al., "3D Printed Air Substrates for the Design and Fabrication of RF Components," IEEE, Jun. 2017.
Ghazali, et al., "3D Printed Metalized Plastic Waveguides for Microwave Components," IMAPS, Oct. 9-10, 2017.
Ghazali, et al., "3D Printed Metalized-Polymer UWB High-Gain Vivaldi Antennas," IEEE, 2016.
Ghazali, et al., "Affordable 3D Printed Microwave Antennas," IEEE, 2015 Electronic Components & Technology Conference.
Ghazali, et al., "Embedded Active Elements in 3D Printed Structures for the Design of RF Circuits," 2018 IEEE 68th Electronic Components and Technology Conference.
Ghazali, et al., "3D Printed Out-of-Plane Antennas for Use on High Density Boards," IEEE, 2017.
Gjokaj, et al., "A Design Study of 3D Printed Reduced Height Waveguide Structures," IEEE, 2018.
Gjokaj, et al., "Novel 3D Printed Half-Width Microstrip Leaky-Wave Antenna," IEEE, 2017.
Harle, et al., "3D Printed 77 GHz Planar Yagi-Uda Antenna," IEEE, 2017.
Harle, et al., "3D Printed Membrane Microstrip Patch Antenna," IEEE, 2017.
He, et al., "A Lego-like Reconfigurable Cavity Using 3D Polyjet Technology," IEEE, 2017.
Hernandez, et al., "Low-Loss RF Filter Through a Combination of Additive Manufacturing and Thin-Film Process," IEEE, 2017.
Kaur, et al., "Affordable Terahertz Components Using 3D Printing," IEEE, 2015 Electronic Components & Technology Conference.
Konstantinou, et al., "A Monolithic Wilkinson Power Divider on Diamond via a Combination of Additive Manufacturing and Thin-film Process," IEEE, 2020.
Park, "Thick 3D Printed RF Components: Transmission Lines and Bandpass Filters," IEEE, 2018.
Pavlidis, et al., "3-D Printed Substrates for MMIC Packaging," IEEE, 2017.
Qayyum, et al., "Ultra Wideband 3D Interconnects Using Aerosol Jet Printing up to 110 GHZ," Proceedings of the 12th European Microwave Integrated Circuits Conference, 2017.
Sorocki, et al., "Broadband Microwave Microfluidic Coupled-Line Sensor With 3D Printed Channel for Industrial Applications," IEEE, Jul. 2020.
Rojas-Nastrucci, et al., "Study on 3D-Printed Coplanar Waveguide Meshed and Finite Ground Planes," 2014.
Gjokaj, et al., "A Compact Receive Module in 3-D Printed Vivaldi Antenna", IEEE, vol. 10, No. 2, Feb. 2020.
Craton, et al., "Additively Manufactured Interdigitated Capacitors Using Barium Titanate Nanocomposite Ink", Proceedings of 49th European Microwave Conference, Oct. 2019.
Ghazali, et al., "A 3D Printed Compact PIFA for 5G Applications", IEEE 2019.
Karuppuswami et al., "A 3D Printed UHF Passive RFID tag for Plastic Components", IEEE 2019.
Gjokaj, et al., "Vivaldi Antenna Array Fabricated Using a Hybrid Process", IEEE 2019.
Mondal, et al., "3D Printed Interposer Layer for High Density Packaging of IoT Devices", IEEE 2019 69th Electronic Components and Technology Conference.
Oakley, et al., "Low-Loss Aerosol-Jet Printed Wideband Interconnects for Embedded Devices", IEEE vol. 9, No. 11, Nov. 2019.
Ghazali, et al., "Embedded Actives Using Additive Manufacturing for High-Density RF Circuits and Systems", IEEE vol. 9, No. 8, Aug. 2019.
Craton, et al., "Fully Additively Manufactured Broadband Low Loss High Frequency Interconnects", Proceedings of 2018 Asia-Pacific Microwave Conference.
Gjokaj, et al., 3D Printed Hybrid Rigid-Flex Coaxial-Like Transmission Line Structures, IEEE 2018.
Ghazali et al., "A 3D Printed Cavity Backed 2×4 Slotted Waveguide Antenna Array", IEEE 2018.
Craton, et al., "Realization of Fully 3D Printed W-band Bandpass Filters using Aerosol Jet Printing Technology", Proceedings 48th European Microwave Conference, Sep. 27, 2018.
Oakley, et al., "Aerosol Jet Printed Quasi-Optical Terahertz Components", IEEE vol. 8, No. 6, Nov. 2018.

(56) References Cited

OTHER PUBLICATIONS

Abt, et al., "Aerosol-Printed Highly Conductive Ag Transmission Lines for Flexible Electronic Devices", IEEE vol. 8, No. 10, Oct. 2018.
Piekarz et al., "Suspended Microstrip Low-Pass Filter Realized Using FDM Type 3D Printing with Conductive Copper-Based Filament", IEEE 2018.
Park et al., "A Near-field Spoof Plasmon THz Probe Using Metallized 3-D printed Plastic", IEEE 2020.

* cited by examiner

METHOD OF ADDITIVELY MANUFACTURING AN INTEGRATED CIRCUIT OF AN INTERCONNECT PACKAGING STRUCTURE

CROSS-REFERENCE TO RELATED APPLICATIONS

This application is a National Phase Entry of International Application Serial No. PCT/US2019/032501, filed on May 15, 2019, which claims priority to U.S. Provisional Application No. 62/673,403, filed on May 18, 2018, both of which are incorporated by reference herein.

GOVERNMENT RIGHTS

This invention was made with government support under DE-NA0002839 awarded by the U.S. Department of Energy. The government has certain rights in the invention.

BACKGROUND AND SUMMARY

The present disclosure generally relates to an interconnect and packaging structure and more particularly to an additively manufactured electrical interconnect.

High frequency electronic devices have emerged as a useful technology for a variety of RF (Radio Frequency) applications ranging from biomedical imaging, radar sensing and high-volume data transmission, for example. As these devices become more popular, more efficient and effective methods for integration of the integrated circuits and interconnect packaging structure are needed. Current methods such as bond-wiring and flip-chip processes present limitations with respect to the interaction between the integrated circuits and the interconnect packaging structure. For example, bond-wiring introduces large inductive discontinuities in the signal path, which hinder performance. Furthermore, flip-chip implementations are prone to breaking and are not conducive to rework since the connections are less accessible once bonded. The present disclosure provides a manufactured interconnect packaging structure that is efficient, effective and overcomes the limitations presented in current methods.

In accordance with the present invention, a method of manufacturing an interconnect packaging structure is provided. In one aspect, the method includes forming a first body defining a cavity around at least one integrated circuit using an additive manufacturing machine (i.e., a 3-D printer), depositing a conductive transmission line on the first body and electrically coupling the conductive transmission line and the at least one integrated circuit with an electrically conductive interconnect. In another aspect, an interconnect packaging structure including a first body, a second body, transmission lines and interconnects is additively manufactured using an additively manufactured machine. In another aspect, an interconnect packaging structure is prepared by a process comprising the steps of forming a first body defining a cavity around at least one integrated circuit using a first dielectric material such that a gap exists between the cavity and the at least one integrated circuit, filling the gap with a second dielectric material to form a second body, depositing a conductive transmission line on the first body and depositing a conductive interconnect onto the second body and onto the at least one integrated circuit such that the conductive interconnect electrically couples the conductive transmission line and the at least one integrated circuit. In a further aspect, an automotive vehicle includes an additively manufactured sensor including an interconnect packaging structure and integrated circuits components.

The interconnect packaging structure manufactured according to the present disclosure is advantageous over traditional devices. For example, the interconnect packaging structure allows for ultra-high frequency broadband interconnects suitable for high power applications without the need for difficult design matching networks and sacrificing thermal performance for electrical performance. Furthermore, aerosol jet deposition of the dielectric materials, the transmission lines and the interconnects reduces the overall size of the interconnect packaging structure while allowing for tight tolerances between the components. Additional advantages and features of the present invention will be readily understood from the following description, claims and appended drawings.

DETAILED DESCRIPTION

Figure 1:
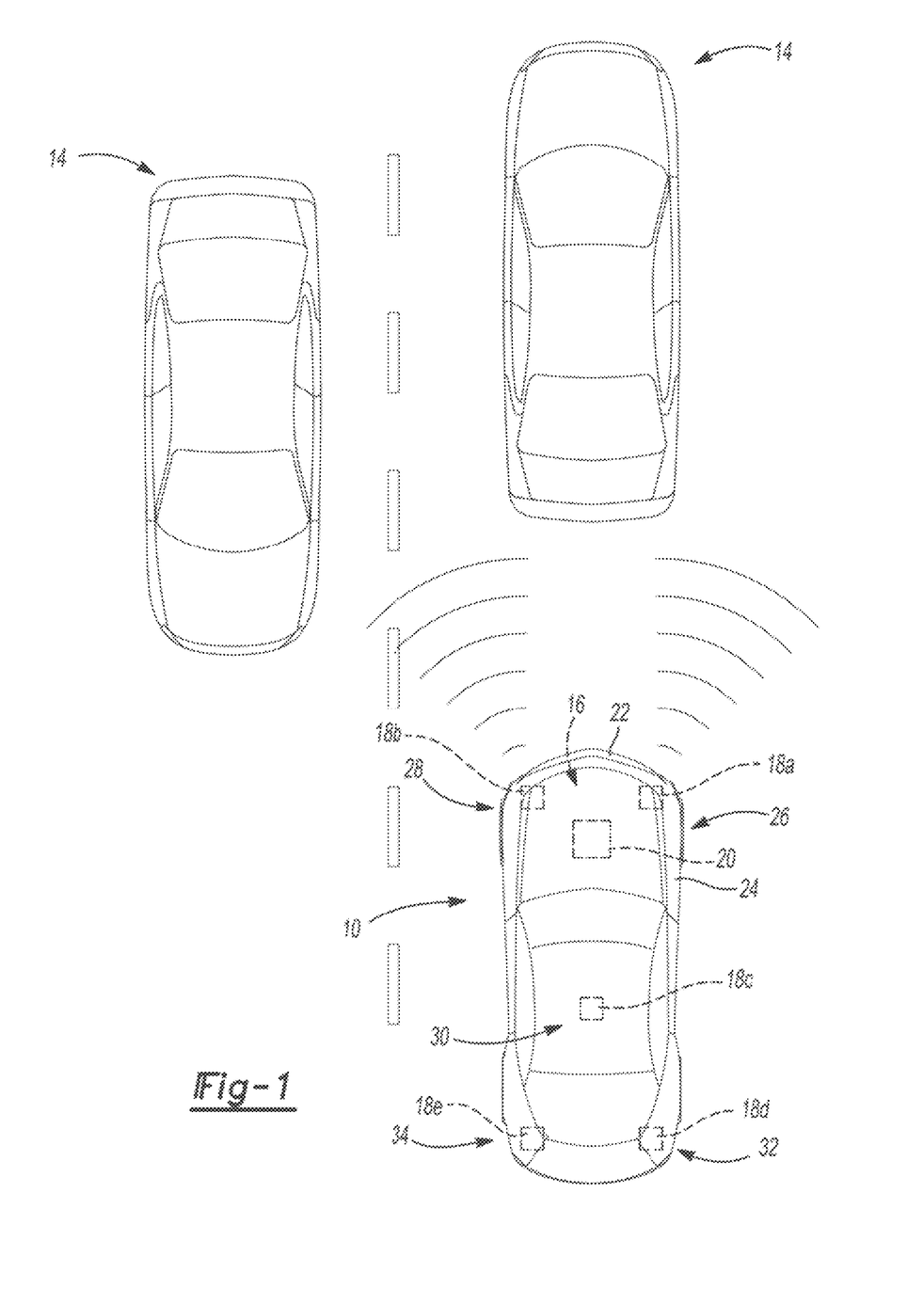
FIG. 1 is a top elevational view showing an automotive vehicle on a roadway having radar sensors.
Figure 2:
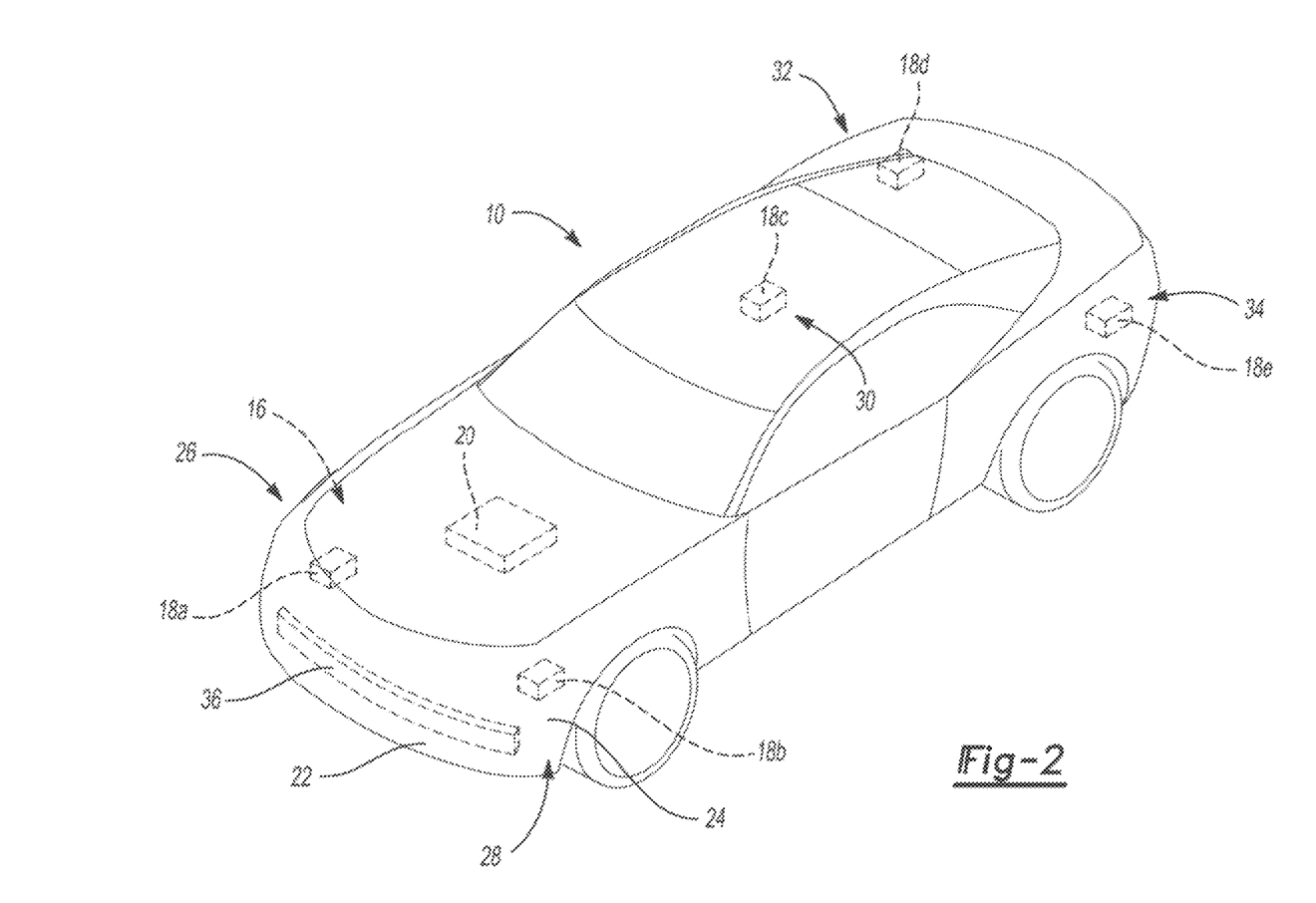
FIG. 2 is perspective view showing the vehicle of FIG. 1 having the radar sensors.

With reference to FIGS. 1 and 2, a primary automotive vehicle 10 (preferably an autonomous vehicle) is provided on a roadway with other automotive vehicles 14. Primary vehicle 10 includes a collision detection system 16 that is capable of sensing and navigating objects, such as other secondary vehicles, posts, or people on or alongside the roadway, in proximity to primary vehicle 10. Collision detection system 16 includes radar sensors 18a, 18b, 18c, 18d and 18e, and a vehicle control module 20.

Radar sensors 18a, 18b, 18c, 18d and 18e operate at various frequencies (including but not limited to 24 and 76 GHz systems) for detecting the secondary objects that are proximate to primary vehicle 10. The field of view for radar sensors 18a, 18b, 18c, 18d and 18e is designed to target the desired detection area to determine proximity of primary vehicle 10 to the objects. Although radar sensors 18a, 18b, 18c, 18d and 18e are disclosed by way of example, other sensors that emit energy to obtain information on surrounding objects would benefit from the present disclosure.

Radar sensors 18a, 18b, 18c, 18d and 18e are mounted behind painted bumpers 22 or vehicle fascia panels 24 at various locations of primary vehicle 10. For example, as shown in FIGS. 1 and 2, radar sensors 18a, 18b, 18c, 18d and 18e are disposed at a front right end 26 of primary vehicle 10, a front left end 28 of primary vehicle 10, a center area 30 of primary vehicle 10, a back right end 32 of primary vehicle 10 and/or a back left end 34 of primary vehicle 10, respectively. As shown in FIG. 2, radar sensors 18a and 18b are mounted behind a crash beam 36 of primary vehicle 10, which, in turn, is located proximate bumper 22. It is also understood that primary vehicle 10 can include other radar sensors disposed at other locations thereof. Control module 20, including an electrical circuit with a microprocessor and memory, is disposed within vehicle 10 and is configured to communicate with radar sensors 18a, 18b, 18c, 18d and 18e. For example, control module 20 communicates with radar sensors 18a, 18b, 18c, 18d and 18e such that radar sensors 18a, 18b, 18c, 18d and 18e continuously transmit signals to or receive signals from the desired detection area.

Figure 3:
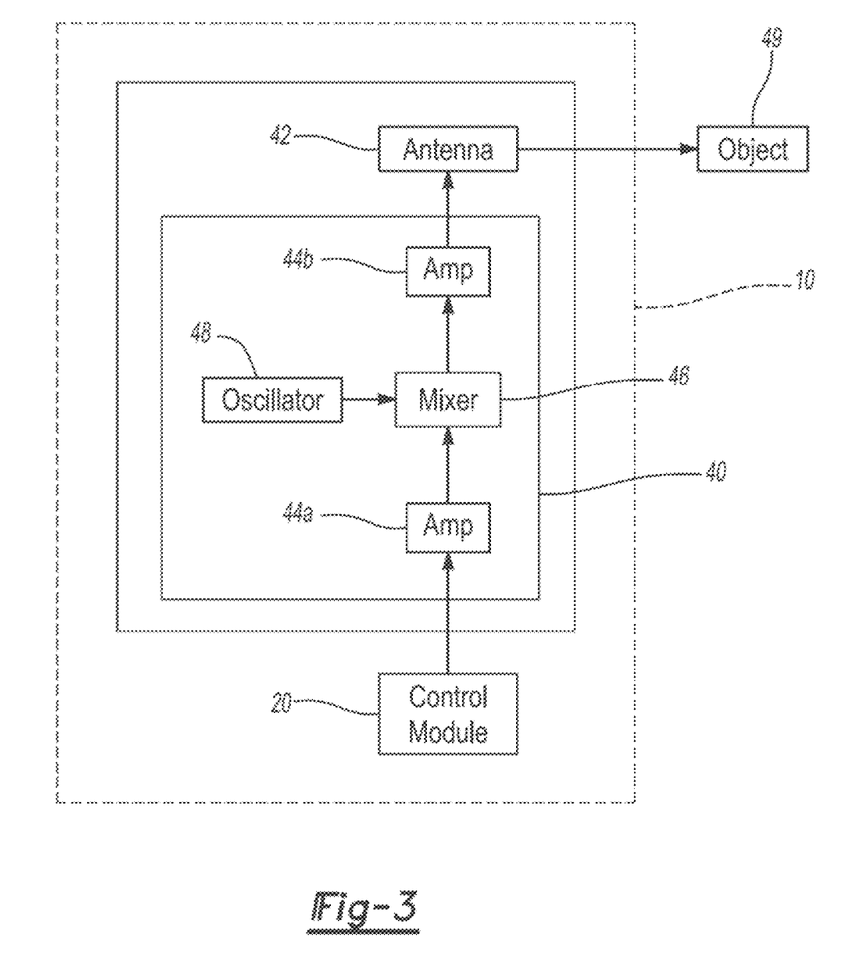
FIG. 3 is a block diagram showing a transmitter system of the radar sensors.

FIG. 3 shows a transmitter system 40 of radar sensors 18a, 18b, 18c, 18d and 18e in communication with vehicle control module 20 and a transmitter antenna 42. Transmitter system 40 includes amplifiers 44a, 44b, a mixer 46 and an oscillator 48. Amplifier 44a amplifies an RF signal generated by transmitter system 40. Mixer 46 receives the amplified RF signal from amplifier 44a and a signal from oscillator 48 and outputs a signal having a common intermediate frequency of the two, which, in turn, is amplified by amplifier 44b and transmitted to the detection area (via transmitter antenna 42) to detect secondary objects 49.

Figure 4:
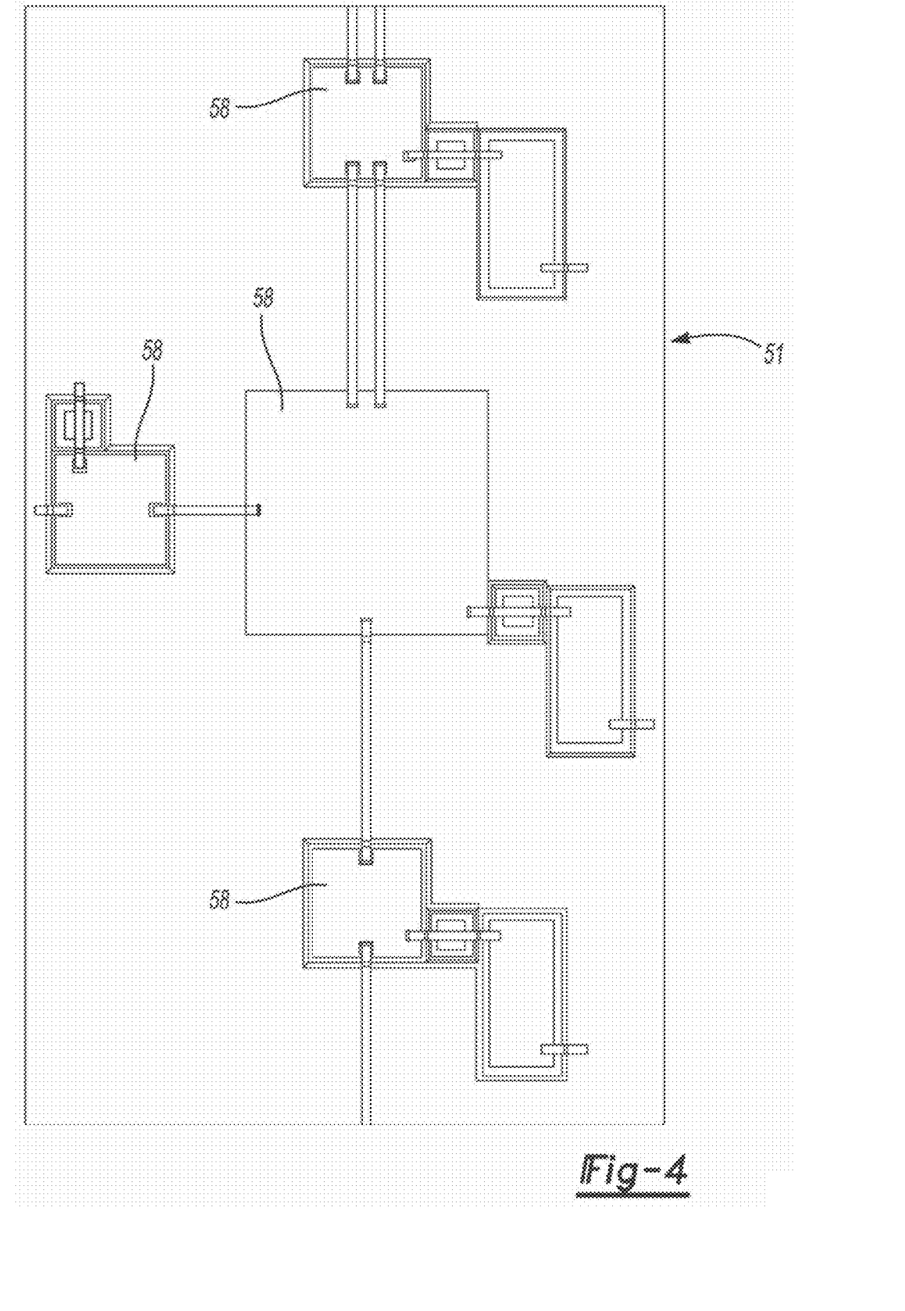
FIG. 4 is a diagram showing an interconnect packaging structure that implements the transmitter system.
Figure 5:
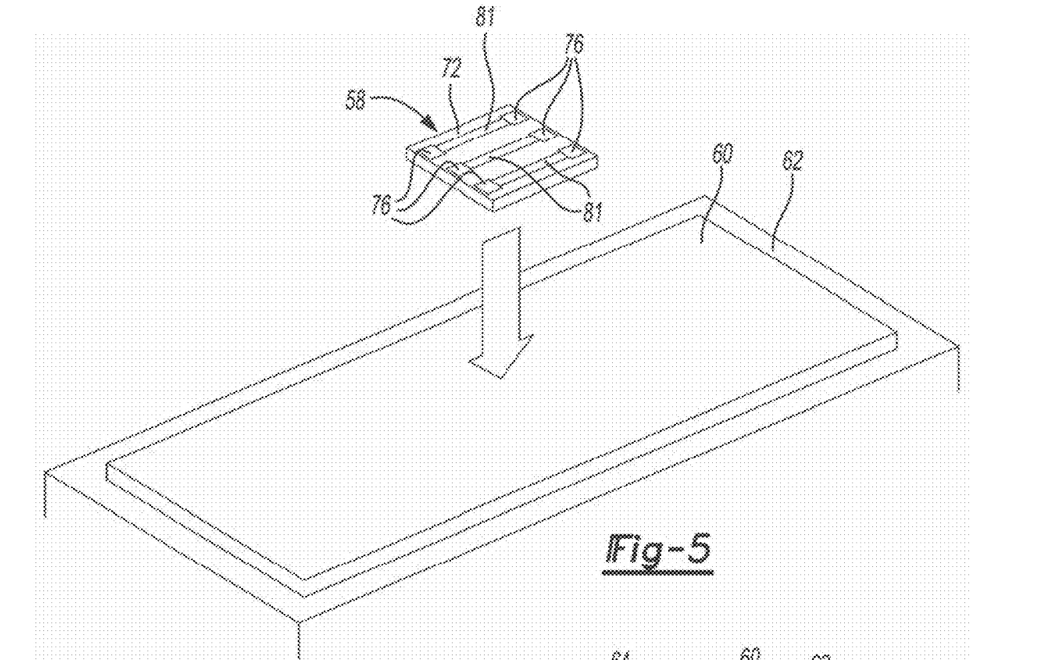
FIG. 5 is a perspective view showing an integrated circuit being located to a substrate.

FIG. 4 is an example of an interconnect packaging structure 51 manufactured according to the present disclosure that implements transmitter system 40 described above. Amplifiers 44a, 44b, mixer 46 and oscillator 48 are represented as integrated circuits 58 on the interconnect packaging structure 51.

With Reference to FIGS. 5-15, a method for additively manufacturing an interconnect packaging structure 52 electrically coupled to integrated circuit 58 will be described in detail. Interconnect packaging structure 52 is manufactured using an Optomec Aersol Jet 5× three-dimensional printer 54, which is capable of additively printing or depositing features on a stacked layer-by-layer basis below 10 μm. In this printer 54, the aerosolized materials are focused through a printer head 56 and a nozzle 57. Nozzle 57 includes a sheath of nitrogen gas which prevents the printing or deposition material from coming into contact with the nozzle. It is understood that multiple nozzles having different deposition characteristics (i.e., deposition speed) may be used one at a time to manufacture the interconnect packaging structure 52. Nozzle 57 operably linearly moves back and forth along a gantry 59 within printer 54 based on signals from a programmable computer controller 61 activating an actuator.

First, integrated circuit 58 is attached to a copper substrate 60 disposed on a table top 62 of printer 54 using any compatible adhesive materials such as a silver film, a gold-tin or conductive epoxy, for example. Next, a first substrate or body 64 defining cavity 66 and made of a first dielectric material, preferably polyimide, is deposited around integrated circuit 58 using printer 54 such that gap 68 approximately 50 μm wide extends around and between a periphery of the cavity 66 and integrated circuit 58. First substrate 64 has a thickness in the range of 50-150 μm, more preferably 100 μm, for example, which is deposited approximately 1 μm layer at a time. Once 20 μm layers have been deposited, the first dielectric material is cured before adding more on top. This process is repeated until first substrate 64 defining cavity 66 has a thickness of approximately 100 μm is formed around integrated circuit 58. Curing is achieved by heating, using a heating element 67 (e.g., hot plate, heat pad, etc.) underneath the table top 62, in a nitrogen atmosphere. First, the first substrate 64 is heated between 150 degrees Celsius and 200 degrees Celsius, preferably 180 degrees Celsius, for at least 15 minutes, more preferably 40 minutes. Then the first substrate 64 is heated between 200 degrees Celsius and 300 degrees Celsius, more preferably 280 degrees Celsius, for at least 15 minutes, more preferably 30 minutes. Finally, the first substrate 64 is heated between 300 degrees Celsius and 400 degrees Celsius, more preferably 300 degrees Celsius for at least 5 minutes, more preferably 10 minutes. Gap 68 allows for change in first substrate 64 during curing thereof, thereby avoiding damage to the interconnect packaging structure 52 and integrated circuit 58.

Figure 6:
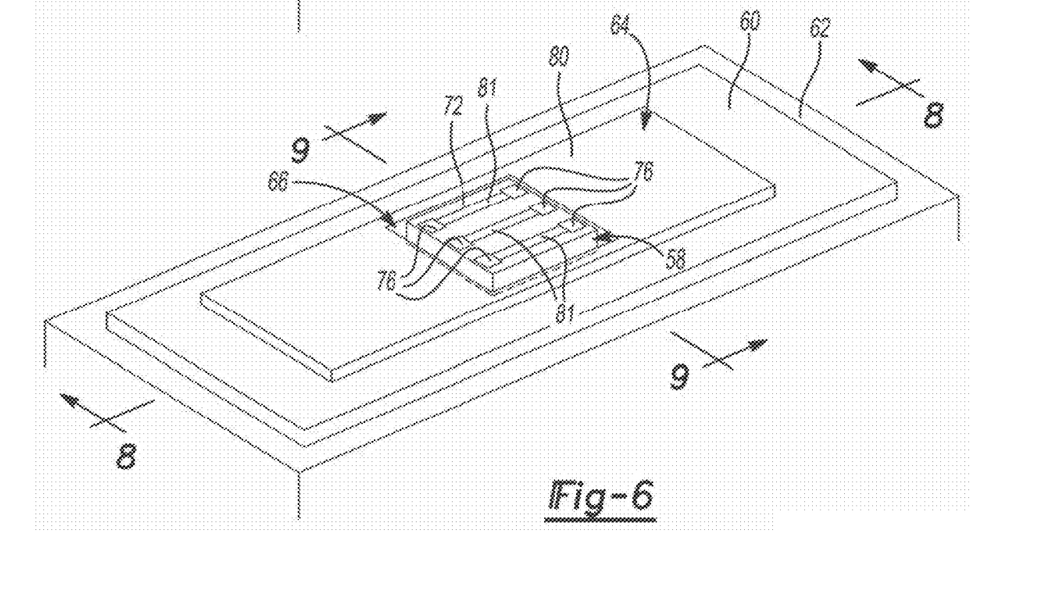
FIG. 6 is perspective view showing a dielectric material of the interconnect packaging structure deposited to the substrate.
Figure 8:
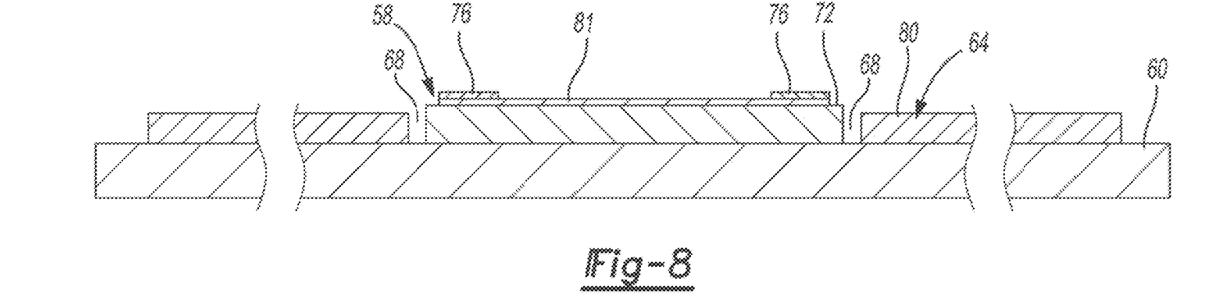
FIG. 8 is a cross-sectional view, taken along line 8-8 of FIG. 6, showing the dielectric material of the interconnect packaging structure.
Figure 9:
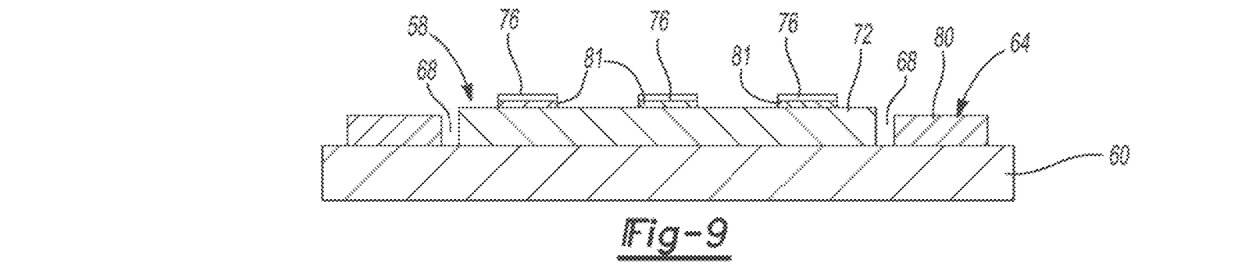
FIG. 9 is a cross-sectional view, taken along line 9-9 of FIG. 6, showing the dielectric material of the interconnect packaging structure.

Next, a second dielectric material, preferably polyimide, is deposited in gap 68 extending around and between the periphery of cavity 66 and integrated circuit 58, thereby, forming a second substrate or body 70. This is done by angling the table top 62 10 degrees and depositing the dielectric material, using the nozzle 57, into gap 68 with no curing, thereby allowing the second dielectric material to fill gap 68 and form second substrate 70. Top surface 72 of integrated circuit 58 sits slightly above gap 68, therefore, filling gap 68 with the second dielectric material forms second substrate 70 having fillets or ramp surfaces 74 around integrated circuit 58. Each ramp surface 74 extends from the periphery of cavity 66 to at least an edge of integrated circuit 58. At least two ramp surfaces 74 extend onto top surface 72 of integrated circuit 58 and are adjacent to respective bonding pads 76.

Figure 7:
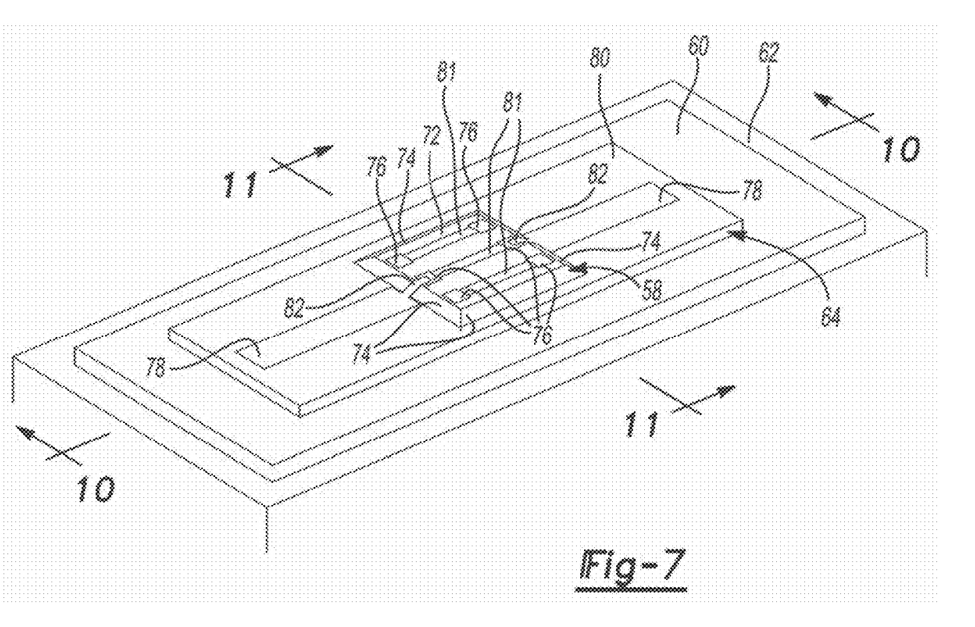
FIG. 7 is a perspective view showing transmission lines and interconnects of the interconnect packaging structure deposited onto the dielectric material.
Figure 10:
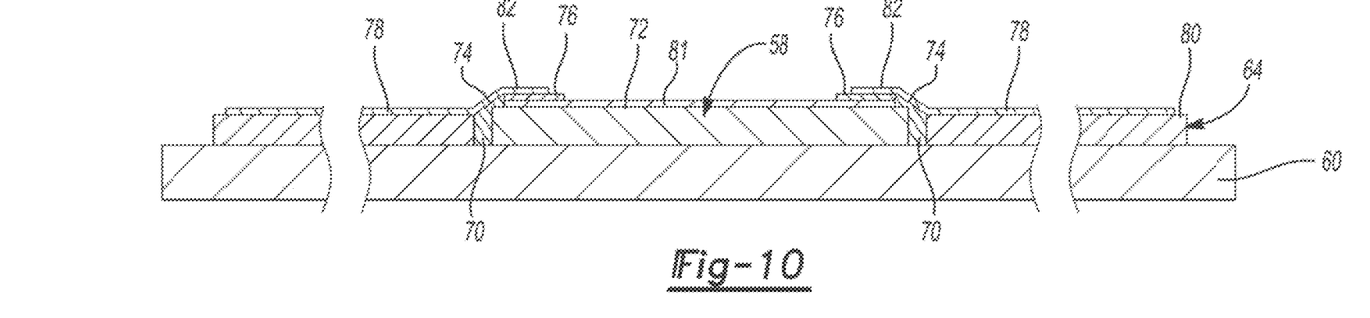
FIG. 10 is a cross-sectional view, taken along line 10-10 of FIG. 7, showing the transmission lines and the interconnects of the interconnect packaging structure deposited onto the dielectric material.
Figures 11, 12:
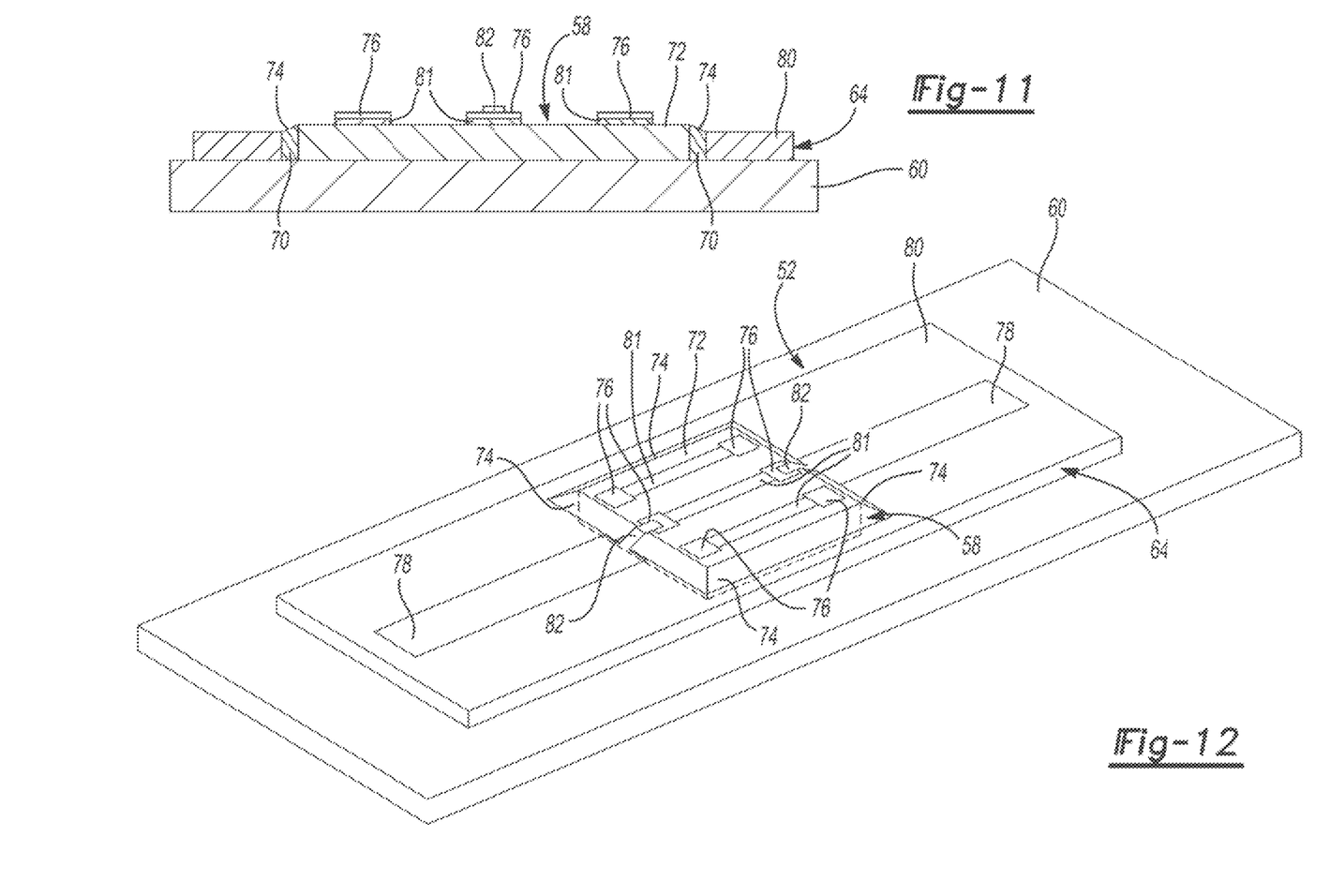
FIG. 11 is a cross-sectional view, taken along line 11-11 of FIG. 7, showing the transmission lines and the interconnects of the interconnect packaging structure deposited onto the dielectric material.
FIG. 12 is a perspective view showing the interconnect packaging structure.
Figure 13:
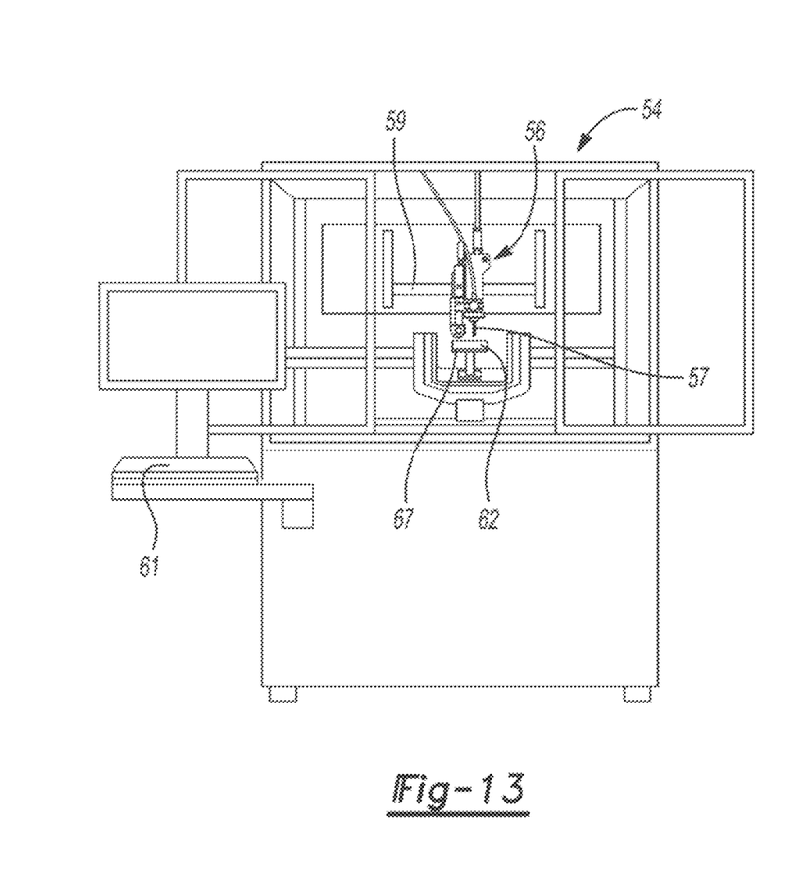
FIG. 13 is a front elevational view showing a three-dimensional printer for printing the packaging structure.
Figure 14:
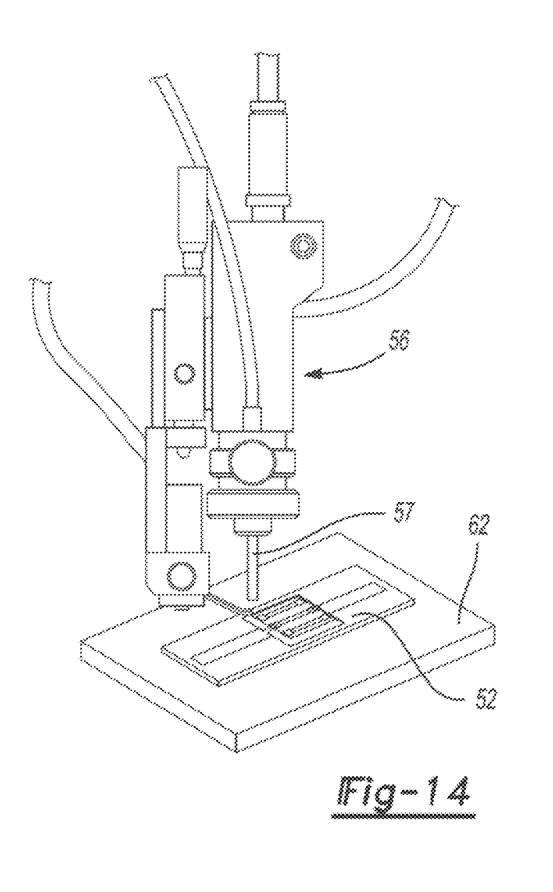
FIG. 14 is a perspective view showing a nozzle of the printer and the interconnect packaging structure of FIG. 12.
Figure 15:
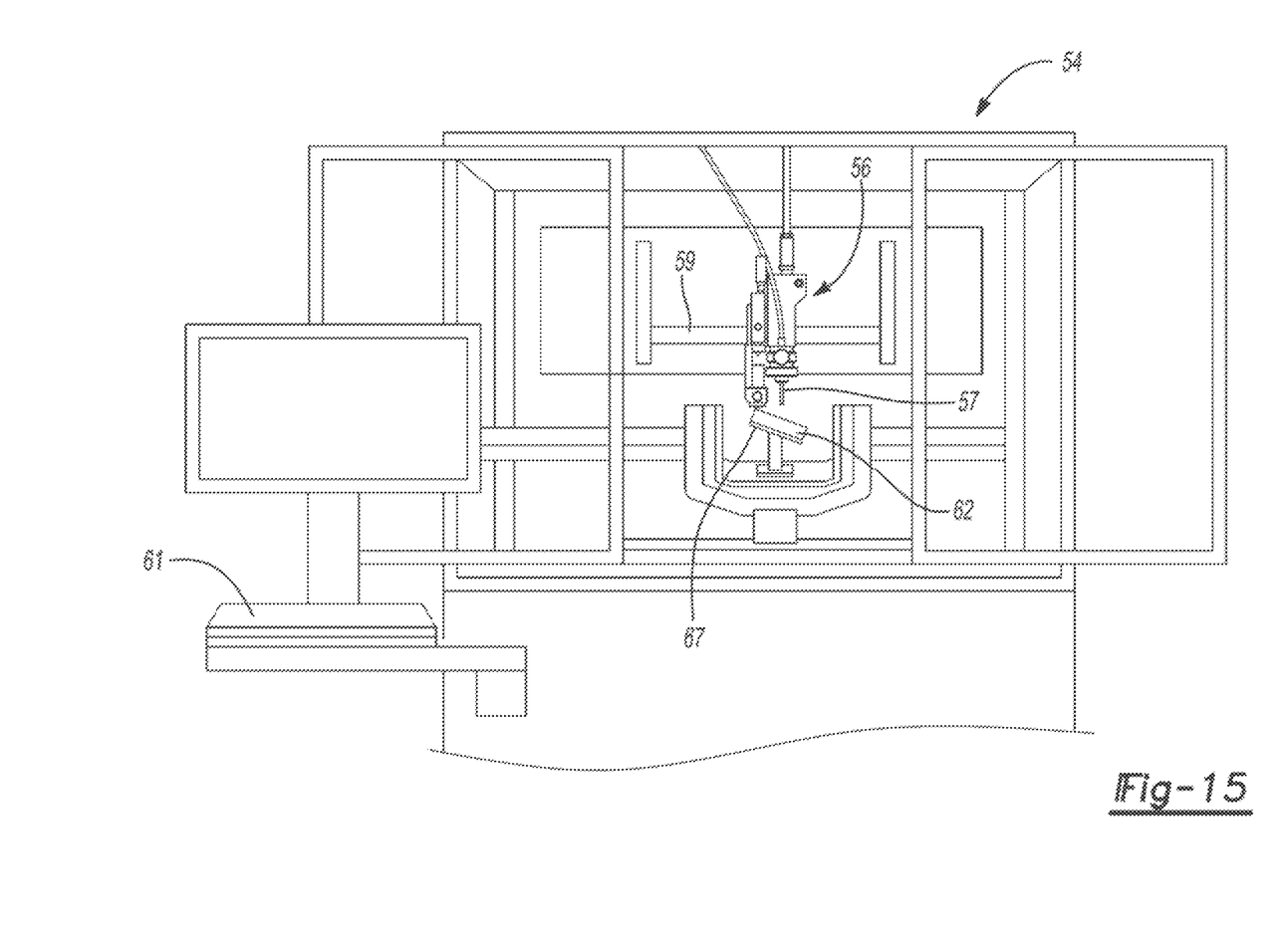
FIG. 15 is a front view elevational view showing a three-dimensional printer for printing the packaging structure.

Next, transmission lines 78, preferably made of silver nanoparticle ink, are deposited onto surface 80 of first substrate 64 using printer 54 and extend from or near an end of first substrate 64 to a respective ramp surface 74. Each transmission line 78 is preferably elongated and of a rectangular top view shape. Electrically conductive interconnects 82, preferably made of silver nanoparticle ink, are deposited onto respective ramp surfaces 74 and onto respective bonding pads 76 of integrated circuit 58 using printer 54, thereby electrically connecting transmission lines 78 and bonding pads 76 on integrated circuit 58. Bonding pads 76 are electrically coupled to ends of elongated conductors 81 that are fabricated on integrated circuit 58 and extend substantially parallel to each other. Interconnects 82 are deposited onto at least two ramp surfaces 74 that extend onto top surface 72 of integrated circuit 58, adjacent to respective bonding pads 76. In this way, interconnects 82 are prohibited from coming into contact with a metal seal ring (not shown)

around integrated circuit 58, thereby preventing an electrical short from interconnects 82 to the metal ring. Each interconnect 82 has a generally rectangular top view shape and more preferably a square shape. Transmission lines 78 and interconnects 82 have a thickness of 2 μm, which is deposited all at one time as oppose to in layers. The table top 62 is angled 10 degrees when the nozzle 57 is depositing interconnects 82 onto ramp surfaces 74 to ensure continuity therewith. Lastly, interconnect packaging structure 52 is cured by heating, using heating element 67 (e.g., hot plate, heat pad, etc.) underneath table top 62, in a nitrogen atmosphere. First, interconnect packaging structure 52 is heated between 150 degrees Celsius and 200 degrees Celsius, preferably 180 degrees Celsius, for at least 15 minutes, more preferably 40 minutes. Then, interconnect packaging structure 52 is heated between 200 degrees Celsius and 300 degrees Celsius, more preferably 280 degrees Celsius, for at least 15 minutes, more preferably 30 minutes. Finally, interconnect packaging structure 52 is heated between 300 degrees Celsius and 400 degrees Celsius, more preferably 300 degrees Celsius for at least 5 minutes, more preferably 10 minutes.

It should be appreciated that additional variations of the manufactured interconnect packaging structure of the present disclosure are also contemplated. For example, an adhesive may be used to facilitate adhesion of first and second substrates 64, 70 onto copper substrate 60. It is also envisioned that first substrate 64 defining cavity 66 may be deposited around integrated circuit 58 such that no gap extends around and between cavity 66 and integrated circuit 58. The thickness of first substrate 64 and second substrate 70 may be determined based on the height of integrated circuit 58 and may be between 50% and 150% of the height of integrated circuit 58. Alternatively, different electrical components and circuitry configurations may be manufactured according to the present method, although certain benefits of the preferred apparatus and method may not be fully realized.

Furthermore, integrated circuit 58 may be attached to a printed circuit board (PCB) as oppose to copper substrate 60. The height of integrated circuit 58 and the thickness of first substrate 64 may be of the same as opposed to being different. Also, the curing can be done in an oven as oppose to using heating element 67 underneath table top 62. It is also envisioned that transmission lines 78 may be deposited onto surface 80 of first substrate 64 and ramp surfaces 74, thereby reducing the length of interconnects 82. While certain materials have been disclosed it should be appreciated that alternate materials may be used although all of the present advantages may not be fully achieved. It is also noteworthy that any of the preceding features may be interchanged and intermixed with any of the others. Variations are not to be regarded as a departure from the present disclosure, and all such modifications are entitled to be included within the scope and spirit of the present invention.

What is claimed is:

1. A method of manufacturing an interconnect packaging structure, the method comprising:
   (a) forming a first body defining a cavity around at least one integrated circuit using an additive manufacturing machine such that a gap exists between a periphery of the cavity and the at least one integrated circuit, the first body made of a first dielectric material;
   the step of forming the first body includes three-dimensionally printing multiple layers to create a dielectric substrate;
   further comprising curing the layers of the dielectric substrate by heating in increasing graduated steps by a heater such that a second curing temperature of a second of the printed layers of the dielectric substrate is greater than a first curing temperature of a first of the printed layers, and a third curing temperature of a third of the printed layers of the dielectric substrate is greater than the second curing temperature of the second of the printed layers;
   (b) filling the gap between the periphery of the cavity and the at least one integrated circuit with a second dielectric material that forms a second body;
   (c) depositing a conductive transmission line on the first body, the conductive transmission line extending a majority of a lateral length of the first body from near an end of the first body to the second body;
   (d) depositing a conductive interconnect onto the second body and onto the at least one integrated circuit, the conductive interconnect electrically coupling the conductive transmission line and the at least one integrated circuit;
   (e) the integrated circuit having a greater thickness than the first body with a top surface located above the first body, and a height of the first body being at least 50% of the integrated circuit with the gap extending between the entire thicknesses of the integrated circuit and the first body; and
   (f) bonding pads of the integrated circuit being electrically coupled to ends of a laterally elongated conductor without bond-wiring, and a lateral length of the transmission line being greater than a lateral length of the conductor.

2. The method of claim 1, wherein:
   the step of filling the gap includes three-dimensionally printing the second dielectric material without curing until the gap is filled;
   the second dielectric material continuously contacts intersecting top and side surfaces defining a corner of the of the integrated circuit and an innermost portion of the second dielectric material ending at an outermost bonding pad located on the top surface; and
   the outermost bonding pad inwardly extending past an innermost edge of the conductive interconnect.

3. The method of claim 2, wherein the filled gap surrounds a periphery of the first body, further comprising changing a depositing angle to create a diagonal upper ramp surface of the second dielectric material during the filling of the gap.

4. The method of claim 1, wherein:
   the step of forming the first body includes three-dimensionally printing multiple layers to create the dielectric substrate with a thickness of 50-150 μm;
   the heater underneath a table top upon which the packaging structure is manufactured.

5. The method of claim 1, further comprising:
   causing the second dielectric material at the gap to extend past an end of the gap and to extend onto a surface of the integrated circuit adjacent a bonding pad;
   the interconnect being deposited onto a top ramp surface of the second dielectric material and onto an underlying one of the bonding pads; and
   the interconnect being deposited as a single layer.

6. The method of claim 1, further comprising:
   attaching the first body to a metallic substrate or printed circuit board which is larger than the first body; and
   using conductive ink to make the transmission line and the interconnect.

7. The method of claim 1, further comprising assembling the interconnect packaging structure within an automotive vehicle sensor.

8. The method of claim 1, further comprising assembling the interconnect packaging structure to a collision detection system including a radar, radio frequency or energy emission transmitter.

9. The method of claim 1, wherein the forming and filling steps are performed by emitting the dielectric materials from at least one nozzle moving back and forth along a gantry based on signals from a programmable computer controller activating an actuator, within a gas atmosphere, further comprising changing an angle of a table surface of the machine upon which the first body is manufactured during one of the depositing steps.

10. A method of manufacturing an interconnect packaging structure, the method comprising:
(a) additively manufacturing multiple layers to create a dielectric substrate around a periphery of an integrated circuit with a surrounding gap between the integrated circuit and the dielectric substrate,
   a second curing temperature of a second of the layers of the dielectric substrate being greater than a first curing temperature of a first of the layers, and
   a third curing temperature of a third of the layers of the dielectric substrate being greater than the second curing temperature of the second of the layers;
(b) filling the gap between the periphery of the cavity and the at least one integrated circuit with a dielectric material;
(c) depositing a conductive transmission line extending a majority of a lateral length of the dielectric substrate from near an end thereof to the gap;
(d) depositing a conductive interconnect on top of a bonding pad of the integrated circuit, the conductive interconnect electrically coupling the conductive transmission line to the integrated circuit; and
(e) electrically coupling the bonding pad to ends of a laterally elongated conductor without bond-wiring, and a lateral length of the transmission line being greater than a lateral length of the conductor.

11. The method of claim 10, wherein the step of filling the gap includes three-dimensionally printing the dielectric material without curing until the gap is filled.

12. The method of claim 10, further comprising changing a depositing angle to create a diagonal upper ramp surface of the dielectric material during the filling of the gap.

13. The method of claim 10, wherein:
the step (a) includes three-dimensionally printing multiple layers to create a dielectric substrate with a thickness of 50-150 μm; and
the curing the layers of the dielectric substrate includes heating in increasing graduated steps by a heater underneath a table top of a three-dimensional printing machine upon which the packaging structure is manufactured.

14. The method of claim 10, further comprising:
causing the second dielectric material at the gap to extend past an end of the gap and to extend onto a surface of the integrated circuit adjacent the bonding pad;
the interconnect being deposited onto a top ramp surface of the dielectric material and onto the underlying bonding pad; and
the interconnect being deposited as a single layer.

15. The method of claim 10, further comprising assembling the interconnect packaging structure within an automotive vehicle sensor.

16. The method of claim 10, further comprising assembling the interconnect packaging structure to a collision detection system including a radar, radio frequency or energy emission transmitter.

17. The method of claim 10, wherein the additively manufacturing and filling steps are performed by emitting the dielectric materials from at least one nozzle moving back and forth along a gantry based on signals from a programmable computer controller activating an actuator, within a gas atmosphere, further comprising changing an angle of a table surface of the machine upon which the first body is manufactured.

18. The method of claim 10, wherein the filling step includes three-dimensionally printing the dielectric material into the gap, the integrated circuit has a greater thickness than the dielectric substrate with a top surface located above the dielectric substrate, and a height of the dielectric substrate is at least 50% of the integrated circuit with the gap extending between the entire thicknesses of the integrated circuit and the dielectric.

* * * * *